(12) United States Patent
Justice et al.

(10) Patent No.: US 6,424,229 B1
(45) Date of Patent: Jul. 23, 2002

(54) TUNABLE VOLTAGE CONTROLLED OSCILLATOR CIRCUIT HAVING AIDED ACQUISITION AND METHODS FOR OPERATING THE SAME

(75) Inventors: Scott R. Justice, Durham, NC (US); Erik L. Bengtsson, Lund (SE)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/874,408

(22) Filed: Jun. 4, 2001

(51) Int. Cl.$^7$ ................................................ H03L 7/00
(52) U.S. Cl. ............................................ 331/4; 331/10
(58) Field of Search ........................... 331/4, 10, 14, 331/16, 17, 25, 36 C, 177 V, 179; 455/255, 260, 264, 265

(56) References Cited

U.S. PATENT DOCUMENTS

| | | | |
|---|---|---|---|
| 4,336,616 A | * 6/1982 | Carson et al. | 455/20 |
| 5,648,744 A | 7/1997 | Prakash et al. | 331/11 |
| 5,903,195 A | * 5/1999 | Lukes et al. | 331/4 |
| 5,942,949 A | 8/1999 | Wilson et al. | 331/17 |
| 6,407,439 | * 10/2001 | Cunning | 33/10 |

OTHER PUBLICATIONS

J. J. Rael, "Physical Processes of Phase Noise in Different LC Oscillators," (4 pages).

* cited by examiner

*Primary Examiner*—Tuan T. Lam
(74) *Attorney, Agent, or Firm*—Myers Bigel Sibley & Sajovec

(57) ABSTRACT

Voltage controlled oscillator circuits are provided including a voltage controlled oscillator (VCO) having an input and an output responsive to the input. A tuning circuit coupled to the VCO sets a relationship between the input and the output of the VCO. An aided acquisition circuit is coupled to the input of the VCO. A control circuit selects a state of the tuning circuit to set the relationship between the input and the output of the VCO. The control circuit also controls operation of the aided acquisition circuit responsive to changes in the state of the tuning circuit. Methods for operating voltage controlled oscillator circuits are also provided. In addition, phase lock loop circuits and mobile terminals including the voltage controlled oscillator circuits are provided.

36 Claims, 8 Drawing Sheets

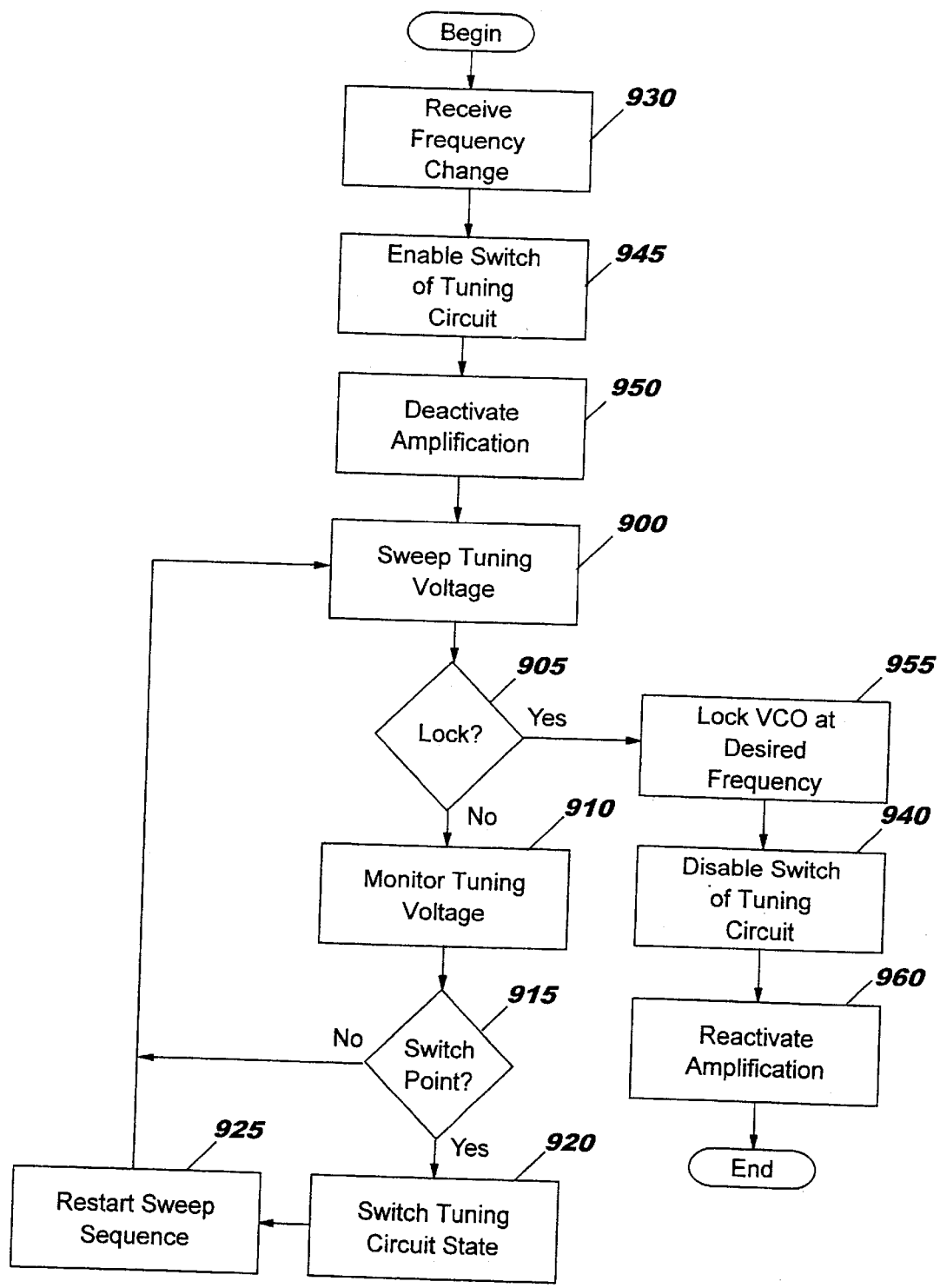

TUNABLE VOLTAGE CONTROLLED OSCILLATOR CIRCUIT HAVING AIDED ACQUISITION AND METHODS FOR OPERATING THE SAME

BACKGROUND OF THE INVENTION

This invention relates to oscillator circuits, and more particularly, to tunable voltage controlled oscillator circuits.

A variety of applications utilize voltage controlled oscillators (VCOs). For example, wireless radio communications systems generally transmit voice and/or other data between transceivers, which may be fixed and/or mobile radio communications terminals, via the propagation of radio frequency (RF) electromagnetic waves. Such applications desirably utilize stable and accurate circuits for generation of oscillating electrical signals used in creating signals in a form suitable for transmission over the wireless system. One circuit widely used to generate such oscillating signals is a phase-lock loop (PLL). A PLL is an electrical circuit that may be used to generate an oscillating output signal that has a constant phase relationship with an oscillating input signal. By utilizing a highly stable and accurate source, such as a crystal oscillator, to generate the oscillating input signal, and various frequency multipliers and dividers, a stable and accurate oscillating output signal can typically be generated across a range of frequencies.

One component of a typical PLL is a VCO. The VCO typically generates an oscillating signal at its output, the frequency of which is responsive to a voltage level applied at its input. In the PLL, the voltage input, referred to herein as the tuning voltage, may be a function of the phase error between the output of the VCO and the desired oscillating signal. The VCO thus may generate an oscillating signal at a frequency that varies over a finite range, corresponding to variations in the tuning voltage over a corresponding finite range.

The specific parameters of this voltage/frequency relationship may depend upon the design of the VCO, the values of electrical components that comprise the VCO, ambient temperature, and other effects known in the electronics arts. Ideally, if plotted on a voltage/frequency axis, the relationship would define a generally linear operating curve with either a positive slope (i.e., an increase or decrease in the tuning voltage causes a corresponding increase or decrease in the frequency of the oscillating signal generated by the VCO) or a negative slope over a "linear" operating range. It is to be understood that a non-linear relationship between the input voltage and the output frequency of the VCO may, in practice, be provided at frequencies above and/or below the generally linear operating range.

To expand the frequency range of a VCO, it is known to selectively couple frequency altering components, such as, capacitors, varactors, FET transistors, and the like, to the resonant circuit in the VCO. This alters the range of frequencies generated in response to the tuning voltage, in effect establishing a new linear operating curve for the VCO. For example, it is known to couple various capacitors to a VCO via a programmable switching matrix such that, by selectively configuring the switches, a plurality of overlapping linear ranges for the VCO may be selected. This ensures that the VCO may be calibrated to compensate for deviations in its linear range due to manufacturing process variations or other parasitic effects, by choosing a VCO operating curve to encompass the desired range of VCO operation. This calibration, also know as VCO trimming, generally occurs in the factory upon manufacturing of the integrated circuit containing the VCO, such as, for example, by burning fuses or by programming a particular value in a register, the contents of which control the switches connecting the transistors to the VCO oscillator. Such a calibration is generally not suited to self-tuning during operation. Alternatively, a complex control relationship based on a plurality of inputs may be used to allow tuning of a VCO in the field rather than at the factory as described, for example, in U.S. Pat. No. 5,648,744.

Another known approach to improving performance of a phase lock loop including a VCO is aided acquisition. Aided acquisition may be added to a phase lock loop (PLL) such as a PLL, utilizing a simple phase detector as an error signal (tuning voltage) generator, as such circuits may have problems with locking under various conditions. An aided acquisition type PLL circuit is illustrated in FIG. 1. As shown in FIG. 1, the PLL 100 includes a VCO 110 which receives a tuning voltage input 130 generated by a phase detector 120. A mixer 140 receives a local oscillator (Lo) signal to provide a feedback circuit from the output of the VCO 110 to the phase detector 120. The PLL 100 shown in FIG. 1, thus, provides a circuit for generating a radio frequency (RF) output signal in response to an intermediate frequency (IF) input signal to the phase detector 120 and the local oscillator reference frequency. It is to be understood that the PLL 100 may include other components, such as filter circuit components, not illustrated in FIG. 1.

The VCO 110 generates the radio frequency (RF) output signal responsive to the tuning voltage 130. The mixer 140 combines the radio frequency output signal with the local oscillator signal to generate an intermediate frequency signal that is compared by the phase detector 120 to the intermediate frequency input signal. Thus, the phase detector 120 generates an output signal whose voltage is dependent on the phase relationship between its two inputs to provide a tuning voltage signal 130 used to drive the VCO 110.

Aided acquisition is provided to the circuit of FIG. 1 by inclusion of a sweep voltage generator 150. The sweep voltage generator 150 typically injects a constant current into the circuit of the PLL 100 on the tuning voltage 130 to generate a frequency sweep by the VCO 110. The sweep voltage generator 150, thus, facilitates locking of the PLL 100 to a desired frequency.

The aided acquisition circuit of FIG. 1 may still be subject to problems with obtaining yield during manufacturing at a desirable phase noise performance level for an integrated VCO type PLL. It is known that the range of frequencies to which the PLL 100 of FIG. 1 may be tuned may depend on the characteristics of the VCO 110. In particular, a trade-off in the design of voltage controlled oscillators is typically the interplay between tuning range and phase noise characteristics of the voltage controlled oscillators due to the potentially limited resolution of the tuning voltage input signal. Thus, by restricting the tuning range of the VCO 110, phase noise may be reduced as fluctuations in the tuning voltage will generate narrower corresponding fluctuations in the output frequency from the VCO 110. However, the resultant frequency range of operation of the PLL 100 may be unsuitable for certain applications.

SUMMARY OF THE INVENTION

In embodiments of the present invention, voltage controlled oscillator circuits are provided including a voltage controlled oscillator (VCO) having an input and an output responsive to the input. A tuning circuit coupled to the VCO sets a relationship between the input and the output of the VCO. An aided acquisition circuit is coupled to the input of the VCO. A control circuit selects a state of the tuning circuit to set the relationship between the input and the output of the VCO. The control circuit also controls operation of the aided acquisition circuit responsive to changes in the state of the tuning circuit. Methods for operating voltage controlled oscillator circuits are also provided. In addition, phase lock loop circuits and mobile terminals including the voltage controlled oscillator circuits are provided.

BRIEF DESCRIPTION OF THE DRAWINGS

FIG. 9 is a flowchart illustrating operations for changing a frequency of transmission for a mobile terminal according to embodiments of the present invention.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As will be appreciated by those of skill in the art, the present invention may be embodied as methods or devices. Accordingly, the present invention may take the form of a hardware embodiment, a software embodiment or an embodiment combining software and hardware aspects.

Figure 2:
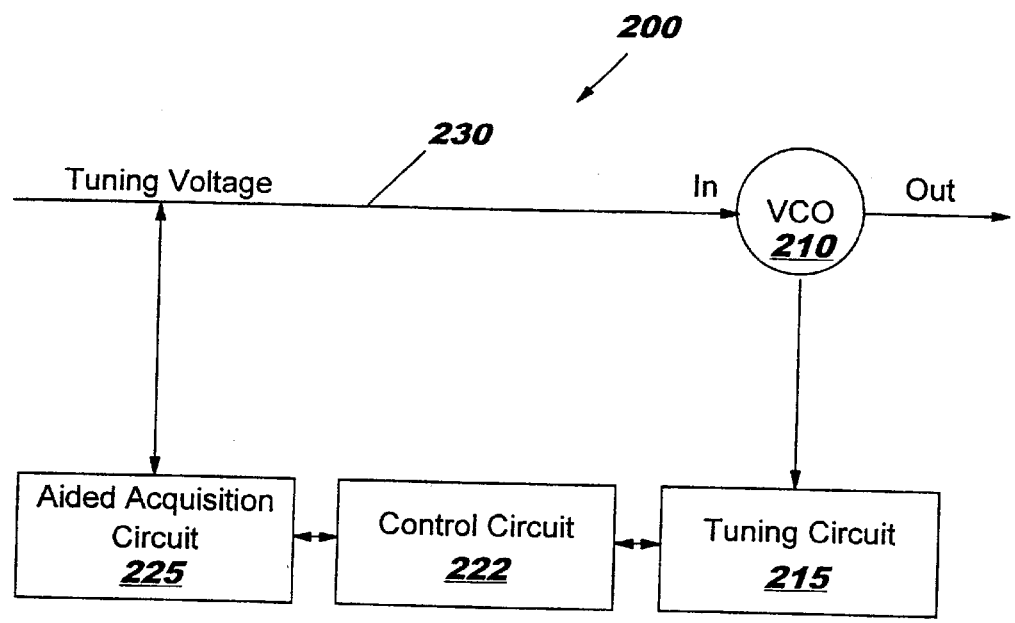
FIG. 2 is a block diagram illustrating a voltage controlled oscillator circuit according to embodiments of the present invention.
Figure 5:
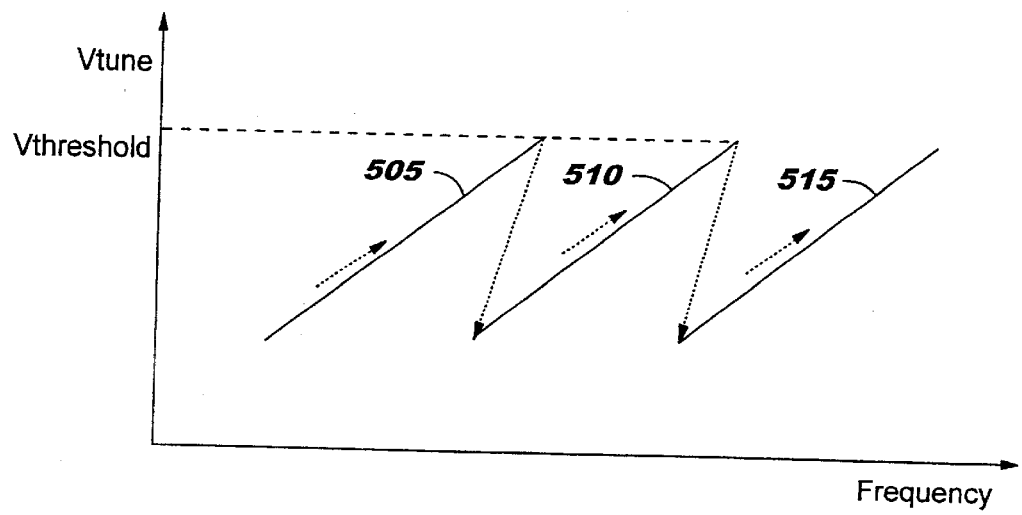
FIG. 5 is a graphical illustration of restarting aided acquisition by resetting a sweep circuit according to embodiments of the present invention.
Figure 6:
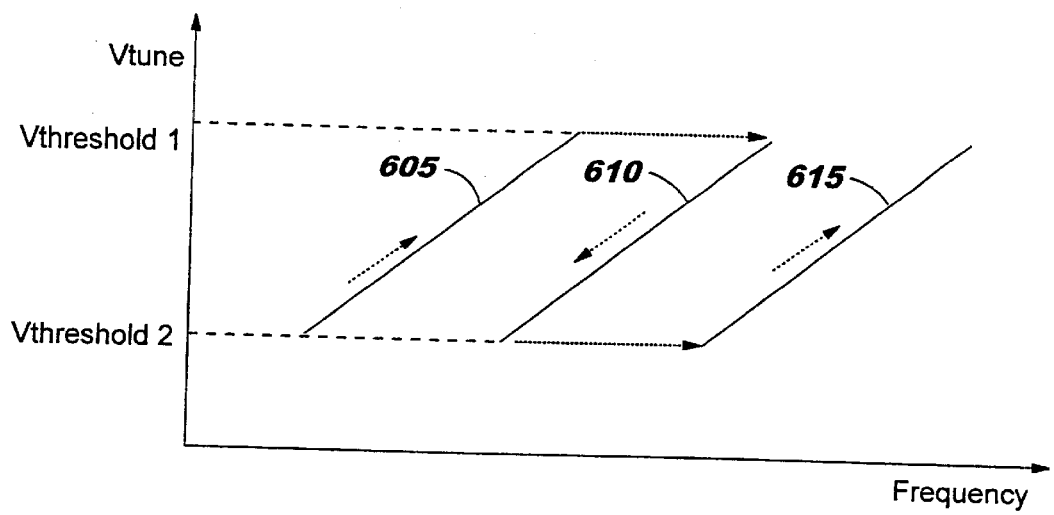
FIG. 6 is a graphical illustration of restarting aided acquisition by switching a sweep direction according to embodiments of the present invention.

FIG. 2 illustrates a voltage controlled oscillator circuit 200 according to embodiments of the present invention. As shown in the embodiments of FIG. 2, the voltage controlled oscillator circuit 200 includes a VCO 210 having an input receiving the tuning voltage signal 230 and generating an output signal responsive to the tuning voltage signal 230. A tuning circuit 215 is coupled to the VCO 210 and sets a relationship between the input and the-output of the VCO 210. For example, as will be described for particular embodiments herein, the tuning circuit 215 may have a plurality of states, each providing a different relationship between the input and the output of the VCO 210. For example, the relationships in each state may be substantially linear voltage/frequency operating curves over offset and overlapping respective frequency ranges as illustrated in FIGS. 5 and 6.

Figure 1:
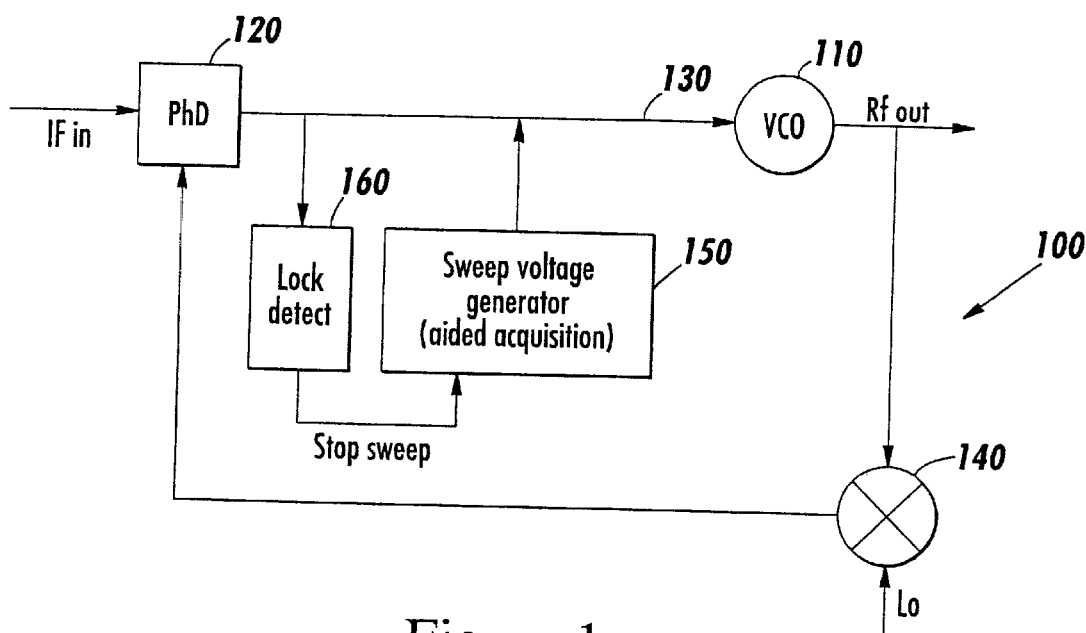
FIG. 1 is a block diagram illustrating a conventional aided acquisition type phase lock loop circuit.

An aided acquisition circuit 225 is also coupled to the input of the VCO 210. The aided acquisition circuit 222 may, for example, be a sweep voltage generator, such as the sweep voltage generator 150 described with reference to FIG. 1 above. A control circuit 225 is coupled to both the tuning circuit 215 and the aided acquisition circuit 225. The control circuit 222 selects a state of the tuning circuit 215 to set the relationship between the input and the output of the VCO 210. The control circuit 222 further controls operation of the aided acquisition circuit 225 responsive to changes in the state of the tuning circuit 215.

In various embodiments, the control circuit 222 may be configured to control operation of the aided acquisition circuit 225 by restarting acquisition operations responsive to changes in the state of the tuning circuit 215 initiated by the control circuit 222. For example, where the aided acquisition circuit 225 is a sweep circuit having an associated sweep direction, the control circuit 222 may be configured to restart acquisition operations by resetting the sweep circuit as will be further described with reference to FIG. 5. In alternative embodiments of the present invention, the control circuit 222 may be configured to restart acquisition operations by switching the sweep direction of the aided acquisition circuit 225 responsive to changes in the state of the tuning circuit 215.

Figure 3:
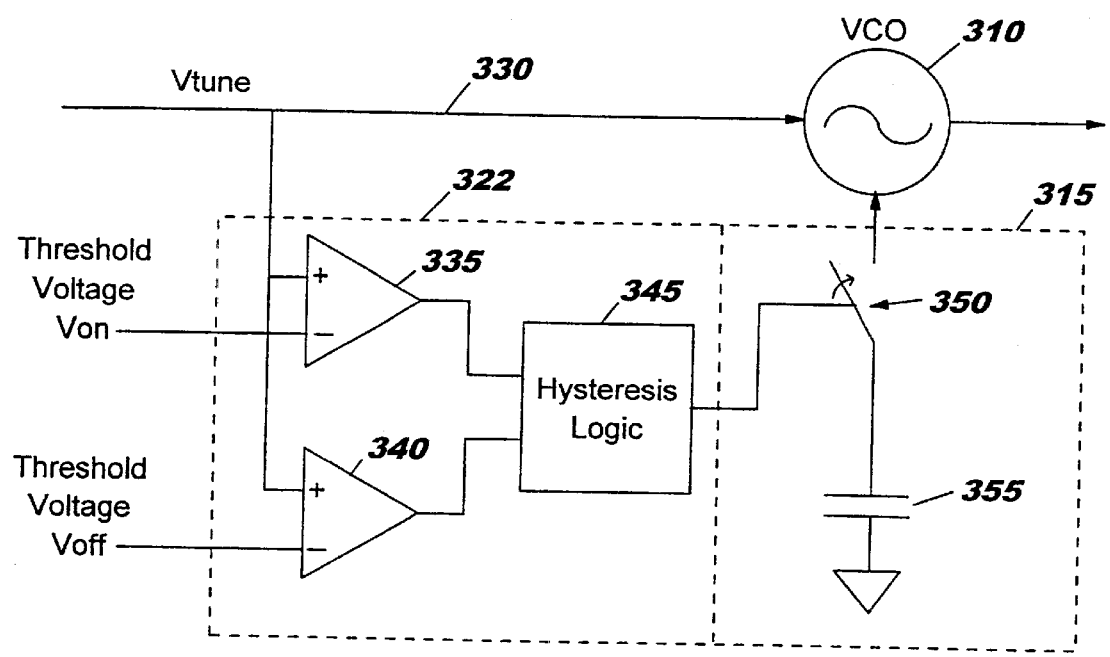
FIG. 3 is a block diagram illustrating a tuning circuit suitable for use with embodiments of the present invention.

A tuning circuit suitable for use with the present invention will now be further described with reference to FIG. 3. As illustrated in FIG. 3, a tuning circuit 315 is coupled to the VCO 310 to establish a relationship between the tuning voltage input 330 of the VCO 310 and the output of the VCO. The tuning circuit 315 includes a switch 350 having a first state which connects the capacitor 355 to the VCO 310 and a second state which disconnects the capacitor 355 from the VCO 310. The characteristic relationship between the input and the output of the VCO 310 is changed by coupling the capacitor 355 to the VCO 310 as will be understood by those of ordinary skill in the art.

Operation of the switch 350 to move between the first and second states supported by the illustrated tuning circuit 315 is controlled by a control circuit 322 including the comparators 335, 340 and the hysteresis logic 345. The comparator 335 receives a first threshold voltage $V_{on}$ signal which is compared to the tuning voltage input 330. The second comparator 340 receives a second threshold voltage $V_{off}$ and compares it to the tuning voltage input 330. The outputs of the comparators 335 and 340 are provided to the hysteresis logic 345 which, in turn, controls switching of the switch 350. It is to be understood, however, that the hysteresis logic 345 in various embodiments of the present invention may be a switch control logic circuit which does not introduce hysteresis to the switching logic. Thus, the tuning circuit 315 selects the first or second relationship between the input and output of the VCO 310 based on a comparison of the tuning voltage 330 to a reference voltage signal or, as illustrated in FIG. 3, signals, to provide switching between relationships at a tuning voltage switch point with hysteresis to reduce undesirable bouncing between the first and second states.

A variety of additional tuning circuits suitable for use with the present invention are further described in U.S. patent application Ser. No. 09/808,264 entitled "Automatic Tuning of VCO" which is incorporated herein by reference as if set forth in its entirety. Further examples of tuning circuits suitable for use with the present invention are described in U.S. Pat. No. 5,648,744. Note that the phase lock loop circuits providing for tuning of the frequency range of a VCO described in these references, which do not incorporate aided acquisition as provided by the present invention, typically require the use of a phase-frequency detector in various application environments as contrasted with the present invention, which may satisfy operational requirements for such applications while using only a phase detector rather than a phase/frequency detector. This may allow for easier design, particularly at higher intermediate frequency input frequencies where use of a mixer is desirable.

Various embodiments of the present invention as described with reference to FIG. 2 may be utilized, for example, in analog circuit topologies, such as application specific integrated circuits (ASICs). Such circuits incorporating the present invention may provide for improved locking of a PLL through the use of a tuning circuit operating in cooperation with an aided acquisition circuit as taught by the present invention.

Figure 4:
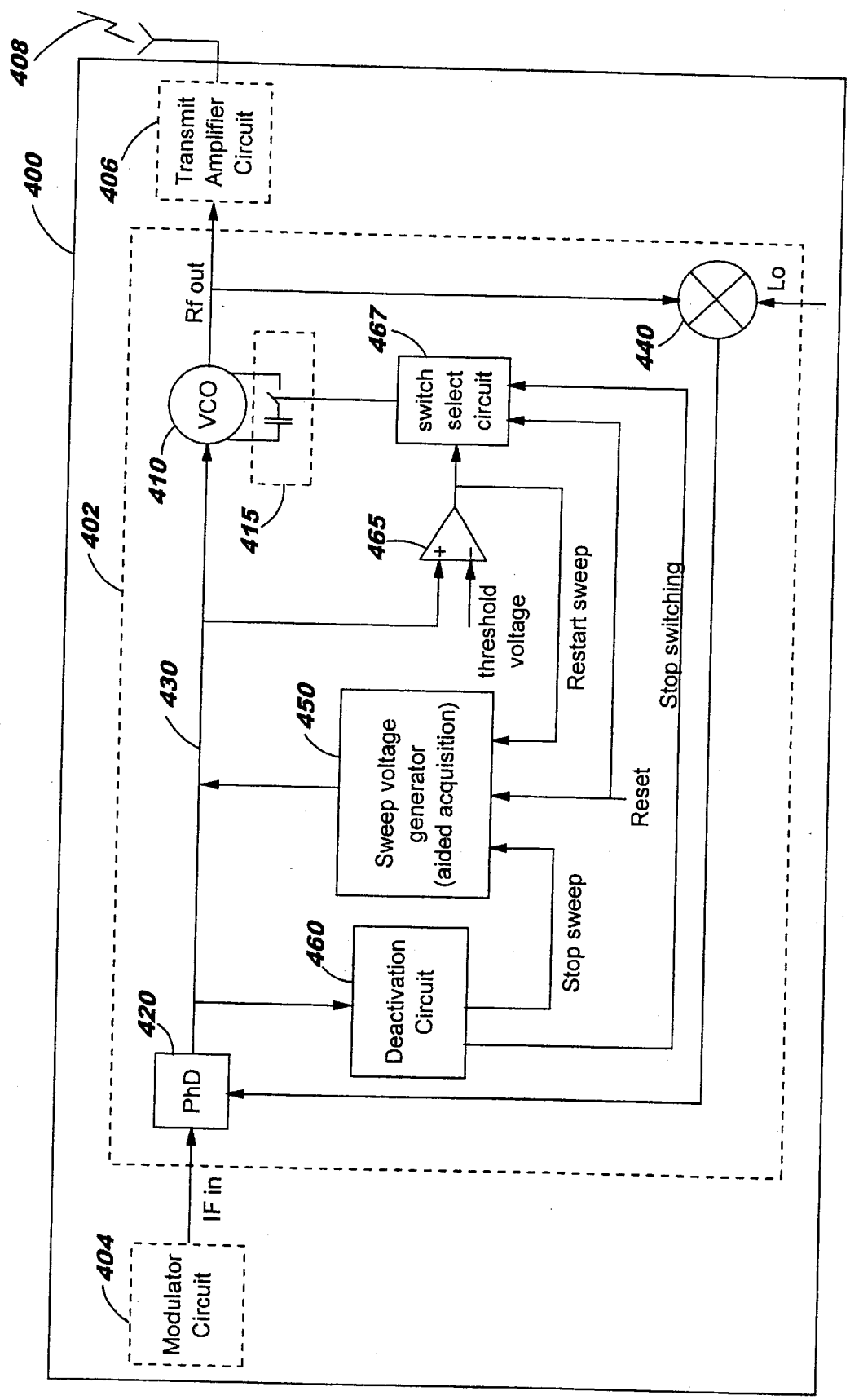
FIG. 4 is a block diagram illustrating a mobile terminal including a phase lock loop having a voltage controlled oscillator circuit according to embodiments of the present invention.

Further embodiments of the present invention will now be described with reference to FIG. 4. FIG. 4 illustrates a mobile terminal including a phase lock loop (PLL) 402 which utilizes a voltage controlled oscillator circuit in accordance with the present invention. The mobile terminal further includes a modulator circuit 404 that provides the intermediate frequency input signal to the PLL 402. Mobile terminal 400 also includes a transmit amplifier circuit 406 which receives the RF output signal from the PLL 402 and amplifies it for transmission over a wireless channel 408 of a wireless communication network. As will be understood by those of skill in the art, a variety of wireless channels 408 may be utilized by the communication network. The different wireless channels 408 may have different associated reference frequencies defining a carrier frequency around which data for communication is modulated based on a frequency modulation protocol provided by the modulator circuit 404 which outputs the intermediate frequency signal provided to the PLL 402. The transmit amplifier 406, thus, provides an information (such as voice or data) carrying signal amplified for transmission using a desired frequency range associated with the assigned wireless channel 408 utilized for the transmission.

The PLL 402, as illustrated in FIG. 4, includes a phase detector 420 which generates a tuning voltage 430 coupled to the input of the VCO 410. The output of the VCO 410 is provided to a mixer 440 where it is combined with a local oscillator signal selected based on the reference frequency for the assigned wireless channel 408 to be used for transmissions. The mixer 440, thus, supports the feedback circuit between the output of the VCO 410 and the input of the phase detector 420. The phase detector 420 generates the tuning voltage 430 based on a comparison of the feedback signal from the mixer 440 and the IF input signal from the modulator circuit 404. The output of the VCO 410 is also coupled to the transmit amplifier circuit 406 for transmission over the wireless channel 408. The feedback circuit including the mixer 440, thus, may lock the output of the VCO 410 for operation at a desired frequency based on the reference frequency for the wireless channel 408 through appropriate selection of the local oscillator signal provided to the mixer 440.

A tuning circuit 415, as described previously with reference to the tuning circuit 215, is coupled to the VCO 410 and sets a relationship between the input and the output of the VCO 410. The tuning circuit 415 is illustrated in FIG. 4 as including a single switch in series with a single capacitor. However, it is to be understood that the tuning circuit 415 may support more than two states, for example, by including a plurality of such switches and capacitors, each associated with a different state of the tuning circuit 415 and providing a different relationship between the input and the output of the VCO 410.

For the embodiment of the PLL 402 shown in FIG. 4, activation of the switch of the tuning circuit 415 is provided by the comparator 465 through the switch select circuit 467. The comparator 465 compares the tuning voltage 430 to a reference threshold voltage and, when the tuning voltage 430 exceeds the threshold voltage, the switch of the tuning circuit 415 is closed, coupling the capacitor of the tuning circuit 415 to the VCO 410. The switch is similarly opened when the tuning voltage 430 falls below the threshold voltage. As described previously, the switch circuit 367 may provide a hysteresis for switching between the states of the tuning circuit 415.

For the embodiments illustrated in FIG. 4, a single threshold voltage is utilized rather than using two reference voltages as described with reference to the control circuit 322 shown in FIG. 3. In other words, the comparator 465 and the switch select circuit 467 provide a control circuit that selects a first state of the tuning circuit 415 based on a comparison of the tuning voltage 430 to a first threshold and a second state based on a comparison of the tuning voltage 430 to a second threshold, where the second threshold is the same as the first threshold (i.e., only a single threshold voltage need be utilized). For example, as shown in FIG. 5, a single threshold voltage $V_{threshold}$ is utilized in selecting each of multiple states. More particularly, while on curve 505, when $V_{tune}$ exceeds $V_{threshold}$, the state moves to curve 510. The capacitor of the tuning circuit 415 thus provides a frequency altering device which may be selectively coupled to the VCO 410 for selecting first and second different relationships between the input and the output of the VCO 410.

The PLL 402 shown in FIG. 4 further includes an aided acquisition circuit 450 illustrated as a sweep generator 450 in FIG. 4. The sweep generator 450 may operate by providing a current source to sweep the frequency. As shown in FIG. 4, the control circuit, more particularly, the comparator 465 of the control circuit, is coupled to a sweep voltage generator 450 to control operations of the sweep voltage generator 450 responsive to changes in the state of the tuning circuit 415 by restarting sweep operations substantially concurrently with changes in the state of the tuning circuit 415. More generally, while illustrated with reference to a sweep voltage generator and restarting sweeping operations, the control circuit restarts acquisition operations in a manner appropriate to the type of circuit selected as the aided acquisition circuit for use in various embodiments of the present invention.

The control circuitry shown in the PLL 402 illustrated in FIG. 4 further includes a deactivation circuit 460. The deactivation circuit 460 connects through the stop switching line to the switch select circuit 467 to disable changes to the state of the tuning circuit 415 responsive to assertion of a deactivation condition. The deactivation circuit 460 is also illustrated as being connected to the sweep voltage generator 450 through the stop sweep signal to deactivate operation of the aided acquisition circuit 450 responsive to assertion of the deactivation condition.

In various embodiments, the deactivation circuit 460 is a lock detector circuit that asserts the deactivation condition when the VCO 410 locks to the desired frequency of operation. In other embodiments of the present invention, the deactivation circuit 460 is a time-out circuit that asserts the deactivation condition at a selected maximum acquisition time after start of an acquisition event reference time. For example, the activation event reference time may be the time at which the local oscillator reference signal to the mixer 440 is changed responsive to switching of the mobile terminal 400 to a new wireless channel 408 operating in a different frequency band from where the mobile terminal 400 was previously operating. The fixed time out period may be selected, for example, as a longest time period which will be allowed by the mobile terminal 400 to wait for lock to be achieved by the PLL 402. The time out approach may be used, for example, in applications where the detection time for a lock detector circuit is too slow.

Operations for various embodiments of the present invention are further graphically illustrated in FIGS. 5 and 6. FIG. 5 illustrates embodiments in which a sweep generator is utilized as the aided acquisition circuit and wherein restarting sweep operations is provided by resetting the sweep circuit. FIG. 5 is based on a PLL in which the tuning circuit has at least three states providing three different substantially linear voltage/frequency operating curves 505, 510, 515, each of which is offset from and overlapping adjacent ones of the curves. The threshold switching voltage $V_{threshold}$ is shown as being selected to limit operations on each of the curves to occurring within the substantially linear portion of the range of operations of the VCO 410. As shown in FIG. 5, an acquisition operation is occurring moving from a lower frequency to a higher frequency or from left from right as illustrated in FIG. 5. The dotted arrow adjacent curve 505 illustrates the direction of sweep of the tuning voltage ($V_{tune}$) while the first state of the tuning circuit 415 associated with curve 505 is selected and the aided acquisition sweep circuit is injecting current to increase the tuning voltage 430 until the threshold voltage is reached. After the threshold voltage is reached, the state of the tuning circuit is changed to select operations on curve 510 and, substantially concurrently therewith, the sweep circuit 450 is reset as shown by the dotted line arrow providing a corresponding drop of the tuning voltage during transition between curve 505 and curve 510. More particularly, as illustrated in FIG. 5, the output of the sweep voltage generator is desirably selected at the reset initialization condition so as to provide for scanning through all frequency ranges without a discontinuous jump in frequency following switching, which could cause a break in the band of frequencies scanned by the PLL 402. Operations continue for the transition between curve 510 and curve 515 as described for the transition between the curves 505 and 510.

Referring now to FIG. 6, operations for an embodiment in which restarting acquisition operations is provided by switching a sweep direction of the tuning voltage produced by a sweep circuit will now be described. As shown in FIG. 6, the tuning circuit 415 provides 3 operating curves 605, 610, 615 corresponding to the curves 505, 510, 515 described with reference to FIG. 5. However, when the high threshold voltage $V_{threshold1}$ is encountered, the sweep generator, rather than being reset, has a different sweep direction for the tuning voltage (i.e., decreasing rather than increasing) selected as illustrated by the dotted line transition at a fixed voltage ($V_{threshold1}$) between curves 605 and 610. Thus, a range of frequencies has not yet been scanned. However, by switching the sweep direction of the tuning voltage from low frequency towards high to high frequency towards low, the operations of the aided acquisition circuit continue to sweep back through the skipped frequency range to insure sweeping across the entire frequency range. As shown in FIG. 6, two threshold voltage signals are utilized, such as illustrated for the tuning circuit shown in FIG. 3, and the lower threshold voltage ($V_{threshold2}$) is used to initiate switching between curve 610 and curve 615 to accommodate for the fact that a backward sweep direction was utilized to sweep along curve 610 before switching back to a forward sweep after transition of the tuning circuit to curve 615.

The operation of various embodiments of the present invention related to restarting acquisition operations have been described above with reference to a sweep generator generating a current output to the input of the VCO along with the output from a phase detector to provide a tuning voltage signal that varies the tuning voltage across a range of frequency outputs. It is to be understood that "restarting" as used herein need not be restarting at a common reference state of the aided acquisition circuit as illustrated in FIG. 5. In other words, for example, the level of $V_{tune}$ after a restart need not be the same across all of the curves 505, 510, 515 but may vary. Furthermore, the aided acquisition circuit need not be a current generator circuit such as a sweep generator. More generally, in various embodiments "restarting" of acquisition operations may be provided by modifying operation of the aided acquisition circuit to allow locking at least across the operating frequency range of the voltage controlled oscillator circuit including the tuning circuit.

The deactivation logic provided by the deactivation circuit 460 may be beneficial for providing stable operation of the PLL 402. For example, it may provide a reduced sensitivity to temperature drift or other environmental conditions and may further insure that modulation of the intermediate frequency input signal to the phase detector 420 by the modulator circuit 404 (i.e, the data signal modulation to be imposed on the reference carrier frequency for transmission) does not itself trigger switching between the operating curves provided by the tuning circuit 415. Unnecessary operation of the aided acquisition circuit 450, which may consume power without any operational benefits, may also be prevented through use of the deactivation circuit 460 to disable the aided acquisition circuit 450 when a lock is obtained. The embodiments illustrated in FIG. 4 further include a reset signal input to the aided acquisition circuit 450 and the switch select circuit 467. The reset circuit may be utilized, for example, to provide a restart of acquisition operations from a desired common initial reference point each time a new wireless channel 408 is desired by the mobile terminal 400.

Figure 7:
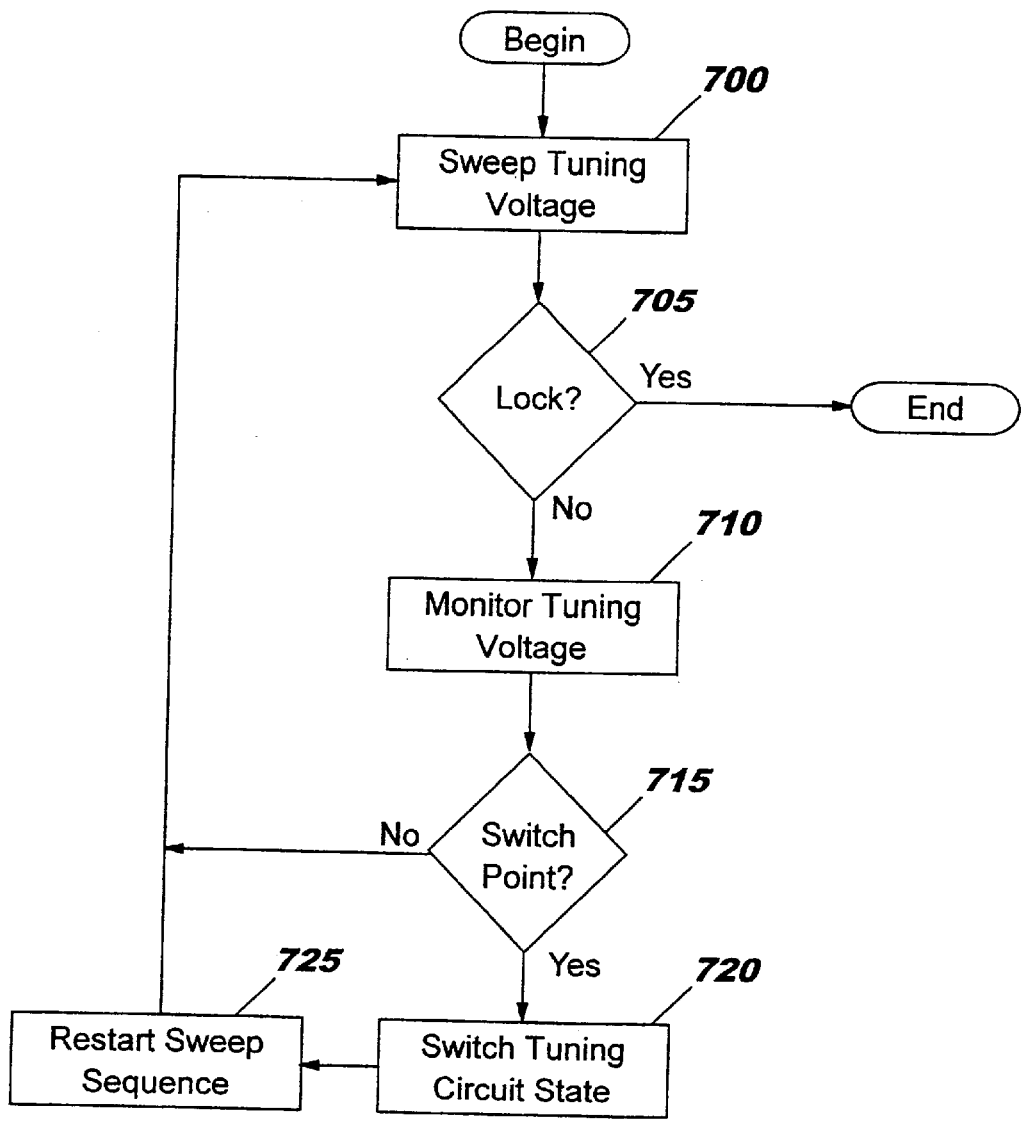
FIG. 7 is a flowchart illustrating operations for locking a voltage controlled oscillator to a new frequency according to embodiments of the present invention.

Operations for locking a VCO according to the present invention will now be described for various embodiments of the present invention with reference to the flowchart illustration of FIG. 7. Operations as shown in FIG. 7 begin with the VCO oscillating and locked at a first frequency with an existing relationship between an input and an output of the VCO defined by an initial state of the tuning circuit 215, 315, 415. The illustrated embodiments in FIG. 7 assume that it is desired to switch to a second frequency. Operations thus begin at block 700 with varying a tuning voltage signal to the input of the VCO over a plurality of values, for example, by sweeping of the tuning voltage signal to the input of the VCO. If a lock is detected, or a time out period expires (block 705), operations end as the second desired frequency is presumably locked. If a lock has not yet been obtained (block 705), the tuning voltage is monitored during sweeping operations (block 710). If a switchpoint for the tuning circuit is reached (block 715) the state of the tuning circuit is switched to select a new operating curve for the VCO (block 720).

For the embodiments illustrated in FIG. 7, a detection of a switch condition at block 715 is based upon the monitored tuning voltage. In addition to switching the state of the tuning circuit (block 720), the tuning voltage to the input of the VCO is varied responsive to switching the state of the tuning circuit to reapply at least one of the plurality of values from the aided acquisition circuit that was previously applied to the input of the VCO, for example, by restarting sweeping of the tuning voltage responsive to switching of the state of the tuning circuit (block 725). Operations return to block 700 to continue from the restarted sweeping state as described previously with reference to block 700 through 720. If a switchpoint has not been reached at block 715, operations return to block 700 and repeat as described for block 700 through 710 without the execution of the switch operations as described for block 720 and block 725. Thus, acquisition operations, as illustrated in FIG. 7, continue until the VCO is locked at the desired second frequency which lock may be obtained with the tuning circuit in a new state providing a different relationship between the input and the output of the VCO. Note that operations as described for FIG. 7 encompass embodiments in which the tuning circuit has more than two states, each associated with a different relationship between the input and the output of the VCO, such as the three states illustrated in FIGS. 5 and 6.

Operations for further embodiments of the present invention will now be described with reference to the flowchart illustration of FIG. 8. Note that operations related to block numbers 800, 805, 810, 815, 820, 825 proceed generally as described for like numbered blocks of FIG. 7 previously, which description will not be repeated with reference to FIG. 8. As shown for the embodiments of FIG. 8, operations begin at block 830 when a new desired frequency for the VCO is received. Sweeping of the tuning voltage to the input of the VCO is restarted responsive to receipt of the new desired frequency (block 835). Operations at block 835 may be supported, for example, by use of the reset signal as shown for the embodiments as illustrated in FIG. 4. In addition to initializing the aided acquisition circuit to a desired state, the circuit illustrated in FIG. 4 further provides the reset signal to the tuning circuit 415, thus also providing for switching the state of the tuning circuit to a desired reference state responsive to receipt of the new desired frequency at block 830.

Figure 8:
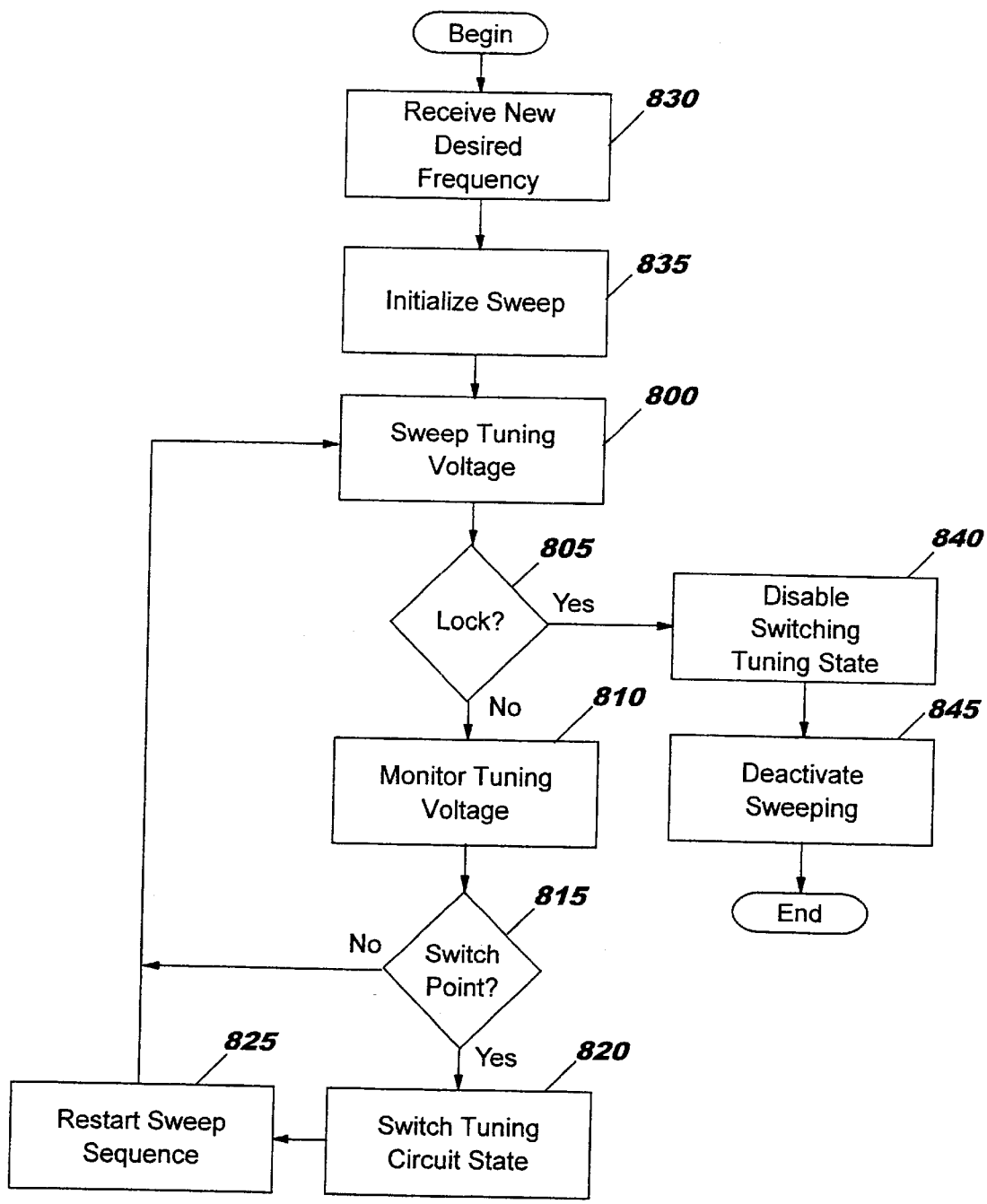
FIG. 8 is a flowchart illustrating operations for locking a voltage controlled oscillator to a new frequency according to further embodiments of the present invention.

The embodiments illustrated in FIG. 8 further show various operations executed when a lock is detected at block 805. On detection of a successful lock or completion of a time out period (block 805), switching of the state of the tuning circuit is disabled (block 840). This disabling of the switching of the state of the tuning circuit may be beneficial in reducing the likelihood that a drift of the $V_{tune}$ signal caused by environmental effects, such as temperature change, will trigger changes in the state of the tuning circuit during transmission operations. In addition, sweeping of the tuning voltage by the aided acquisition circuit may also be deactivated in various embodiments of the present invention (block 845). The circuit illustrated in FIG. 4, for example, may support operations as described for blocks 840 and 845 through use of the stop sweep and stop switching output signals of the deactivation circuit 460.

Operations for changing a mobile terminal from transmitting on a first channel of a wireless network to a second channel of the wireless network will now be described with reference to various embodiments of the present invention as illustrated in FIG. 9. Note that the first channel of the wireless network has a first associated modulation reference frequency, such as a carrier frequency, which is different from the associated modulation reference frequency for the second channel of the wireless network, thus, requiring switching of the locking of the phase lock loop of the mobile terminal from a first lock frequency to a new lock frequency associated with the second channel. Thus, operations begin with detection of the need to transition from the first channel to the second channel, for example, by receiving a frequency change request (block 930). This may be provided, for example, with reference to the embodiments illustrated in FIG. 4, by a change to the local oscillator frequency and a reset signal on the reset line. Switching of the tuning circuit of a phase lock loop of the mobile terminal is then enabled (block 945).

Amplification of the output of the VCO of the phase lock loop of the mobile terminal by the amplifier circuit of the mobile terminal is deactivated while switching of the tuning circuit is enabled (block 950). Such transmit amplification may be undesirable in mobile terminal environments as transmissions at the varying frequencies encountered while lock is being obtained could interfere with adjacent channels operating to support communications by other mobile terminals which other such communications could be disrupted and even lost as a result of transmissions at high power by the mobile terminal using frequencies not assigned to the mobile terminal.

Operations related to locking the phase lock loop at the new desired frequency as shown for blocks block 900, 905, 910, 915, 920, 925 proceed substantially as described with reference to FIG. 7 and will not be further described with reference to FIG. 9. For the embodiments illustrated in FIG. 9 further details of operations when a lock is acquired to the second channel frequency or a maximum acquisition time period has expired (block 905) will now be described with reference to blocks 955, 940 and 960. Locking of the VCO to the new desired frequency is illustrated at block 955. Switching of the tuning circuit is then disabled responsive to successful locking of the VCO at the second desired frequency (block 940). Furthermore, amplification of the output of the VCO by an amplifier circuit 406 of the mobile terminal 400 coupled to the output of the VCO is reactivated while switching of the tuning circuit 415 is disabled (block 960). In various embodiments of the present invention, operations related to deactivating amplification at block 950 and reactivating amplification at 960 may further include deactivating and reactivating varying of the frequency of the output signal of a modulation circuit 404 coupled to the phase lock loop 402 of the mobile terminal to prevent modulation of the frequency signal input to the PLL 402 while switching of the tuning circuit 415 is enabled.

Disabling of modulation of the frequency input during locking acquisition operations may help insure that the variations in the input frequency caused by the modulation itself do not undesirably cause toggling between different operating curves of the VCO. For example, the reference frequency for a channel of the wireless network may fall very close to a switching point frequency (i.e., the overlapping frequency range) between two operating curves of the VCO. In such a condition, a successful lock may be obtained at the desired frequency in a location very close to the switching point of the tuning circuit. The change of frequency provided by a modulation circuit to encode data as reflected in the intermediate frequency input signal provided to the phase detector of the PLL may then generate a sufficient change in a tuning voltage output by the phase detector to trigger switching of the tuning circuit. While the phase lock loop would be expected to nonetheless quickly reacquire the desired frequency, during the switch, lock would be lost for likely some transitional period which may be sufficient to cause disruption of communications by other mobile terminals. Accordingly, in various embodiments of the present invention, the modulation circuit 404 is prevented from varying the frequency of the intermediate frequency input signal to the phase detector 420 while switching of the tuning circuit 415 is enabled.

It is to be understood that voltage controlled oscillator circuits and methods for using the same according to the present invention may be utilized in a variety of applications where it is known to use conventional voltage controlled oscillators. One application which may be particularly benefited by the circuits and methods of the present invention is in communication devices, including wireless communication devices such as wireless mobile terminals as shown FIG. 4. Such a mobile terminal 400 may include a variety of components including, for example, a transmitter, a receiver, a user interface and an antenna system. The transmitter typically converts the information which is to be transmitted by the mobile terminal into an electromagnetic signal suitable for radio communications. The receiver demodulates electromagnetic signals which are received by the mobile terminal so as to provide the information contained in the signals to the user interface in a format which is understandable to the user. The receiver generally includes an RF processor and a baseband processor. A wide variety of transmitters, receivers, and user interfaces (e.g., microphones, keypads, displays) which are suitable for use with handheld radiotelephones are known to those of skill in the art, and such devices may be modified to incorporate voltage controlled oscillator circuits in accordance with the present invention. Other than the voltage controlled oscillator circuits and methods of the present invention, the design of such a radiotelephone is well known to those of skill in the art and will not be further described herein. It is further to be understood that the present invention is not limited to radiotelephones and may also be utilized with other wireless and wired communication receivers.

The present invention was generally described herein with reference to FIGS. 4 and 9 in the context of a wireless terminal or mobile terminal. As used herein, the term "wireless terminal" or "mobile terminal" may include, but is not limited to, a cellular radiotelephone with or without a multi-line display; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Wireless terminals may also be referred to as "pervasive computing" devices and may be mobile terminals.

Operations of the present invention have been described with respect to the block diagram illustrations of FIGS. 2 through 4 and the flowchart illustrations of FIGS. 7 through 9. It will be understood that each block of the flowchart illustrations and the block diagram illustrations of FIGS. 2 through 9, and combinations of blocks in the flowchart illustrations and the block diagram illustrations, can be implemented by computer program instructions. These program instructions may be provided to a processor to produce a machine, such that the instructions which execute on the processor create means for implementing the acts specified in the flowchart and block diagram block or blocks. The computer program instructions may be executed by a processor to cause a series of operational steps to be performed by the processor to produce a computer implemented process such that the instructions which execute on the processor provide steps for implementing the operations specified in the flowchart and block diagram block or blocks.

Accordingly, blocks of the flowchart illustrations and the block diagrams support combinations of means for performing the specified acts, combinations of steps for performing the specified acts and program instruction means for performing the specified acts. It will also be understood that each block of the flowchart illustrations and block diagrams, and combinations of blocks in the flowchart illustrations and block diagrams, can be implemented by special purpose hardware-based systems which perform the specified operations or steps, or by combinations of special purpose hardware and computer instructions. For example, the control circuit 222 of FIG. 2 may be implemented, as code executing on a processor, as integrated circuit devices, such as signal processors or custom chips alone or in combination with discrete electronic circuit devices, or as a combination of the above.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A voltage controlled oscillator circuit comprising:
    a voltage controlled oscillator (VCO) having an input and an output responsive to the input;
    a tuning circuit coupled to the VCO having a plurality of states that set a relationship between the input and the output of the VCO;
    an aided acquisition circuit coupled to the input of the VCO; and
    a control circuit that selects one of the plurality of states of the tuning circuit to set the relationship between the input and the output of the VCO and that controls operation of the aided acquisition circuit responsive to the selected state of the tuning circuit.

2. The circuit of claim 1 wherein the control circuit is configured to control operation of the aided acquisition circuit by restarting acquisition operations responsive to changes in the state of the tuning circuit.

3. The circuit of claim 2 wherein the aided acquisition circuit is a sweep circuit having a sweep direction and wherein the control circuit is configured to restart acquisition operations by resetting the sweep circuit or by switching the sweep direction of the sweep circuit responsive to changes in the state of the tuning circuit.

4. The circuit of claim 2 wherein the VCO and the tuning circuit provide the voltage controlled oscillator circuit an operating frequency range based on the states of the tuning circuit and wherein restarting acquisition operations comprises modifying operation of the aided acquisition circuit responsive to changes in the state of the tuning circuit to allow locking across the operating frequency range of the voltage controlled oscillator circuit.

5. The circuit of claim 4 wherein the control circuit further comprises a deactivation circuit coupled to the aided acquisition circuit that deactivates operation of the aided acquisition circuit responsive to a deactivation condition.

6. The circuit of claim 5 wherein the deactivation circuit comprises either a lock detector circuit that signals the deactivation condition when the VCO locks to a desired frequency or a time-out circuit that signals the deactivation condition at a selected maximum acquisition time after a start of an acquisition event reference time.

7. The circuit of claim 4 wherein the control circuit further comprises a deactivation circuit that disables changes to the state of the tuning circuit responsive to a deactivation condition.

8. The circuit of claim 7 wherein the deactivation circuit comprises either a lock detector circuit that signals the deactivation condition when the VCO locks to a desired frequency or a time-out circuit that signals the deactivation condition at a selected maximum acquisition time after a start of an acquisition event reference time.

9. The circuit of claim 7 wherein the tuning circuit comprises at least one frequency altering device coupled to the VCO in a first state of the tuning circuit and decoupled from the voltage controlled oscillator in a second state of the tuning circuit to set respective first and second relationships between the input and the output of the VCO.

10. The circuit of claim 9 wherein the input of the VCO comprises a tuning voltage and wherein the first relationship comprises a first substantially linear voltage/frequency operating curve over a first output frequency range at the output of the VCO and the second relationship comprises a second substantially linear voltage/frequency operating curve over a second output frequency range offset from and overlapping the first output frequency range.

11. The circuit of claim 10 wherein the control circuit comprises a comparator circuit coupled to the input of the VCO that selects the first state based on a comparison of the tuning voltage to a first threshold and the second state based on a comparison of the tuning voltage to a second threshold.

12. The circuit of claim 11 wherein the first threshold and the second threshold are the same.

13. The circuit of claim 12 wherein the comparator circuit further provides a hysteresis for switching between the first state and the second state.

14. The circuit of claim 2 wherein the aided acquisition circuit comprises a sweep circuit.

15. The circuit of claim 14 wherein the sweep circuit has a sweep direction and wherein the control circuit is configured to restart acquisition operations by resetting the sweep circuit or by switching the sweep direction of the sweep circuit responsive to changes in the state of the tuning circuit.

16. The circuit of claim 15 wherein the sweep circuit comprises a sweeping current source.

17. The circuit of claim 15 wherein the control circuit further comprises a deactivation circuit coupled to the aided acquisition circuit that deactivates operation of the aided acquisition circuit responsive to a deactivation condition.

18. The circuit of claim 15 wherein the control circuit further comprises a deactivation circuit coupled to the tuning circuit that disables change to the state of the tuning circuit responsive to a deactivation condition.

19. The circuit of claim 15 wherein the tuning circuit comprises at least one frequency altering device coupled to the VCO in a first state of the tuning circuit and decoupled from the voltage controlled oscillator in a second state of the tuning circuit to set respective first and second relationships between the input and the output of the VCO.

20. The circuit of claim 19 wherein the input of the VCO comprises a tuning voltage and wherein the first relationship comprises a first substantially linear voltage/frequency operating curve over a first output frequency range at the output of the VCO and the second relationship comprises a second substantially linear voltage/frequency operating curve over a second output frequency range offset from and overlapping the first output frequency range.

21. The circuit of claim 20 wherein the control circuit comprises a comparator circuit coupled to the input of the VCO that selects the first state based on a comparison of the tuning voltage to a first threshold and the second state based on a comparison of the tuning voltage to a second threshold.

22. The circuit of claim 15 wherein the input of the VCO comprises a tuning voltage, wherein the circuit comprises a phase lock loop circuit, the circuit further comprising:

a phase detector circuit that generates the tuning voltage responsive to an input frequency signal and a feedback signal from the output of the VCO;

a feedback circuit that generates the feedback signal; and wherein the control circuit selects the state of the tuning circuit based on the tuning voltage.

23. A phase lock loop circuit for a mobile terminal, the mobile terminal having a frequency modulator circuit that modulates a signal for communication over a wireless channel associated with a reference frequency and a transmit amplifier circuit that amplifies the modulated signal for transmission over the channel, the phase lock loop circuit coupled between the modulator circuit and the transmit amplifier circuit and comprising:

a voltage controlled oscillator (VCO) having a tuning voltage input based on the modulated signal from the modulator circuit and an output responsive to the input that is coupled to the transmit amplifier circuit for transmission over the channel;

a feedback circuit that locks the output of the VCO at a desired frequency based on the reference frequency for the wireless channel;

a tuning circuit coupled to the VCO that sets a relationship between the input and the output of the VCO;

an aided acquisition circuit coupled to the input of the VCO that aids acquisition of the lock of the output of the VCO at the desired frequency; and a control circuit that selects a state of the tuning circuit to set the relationship between the input and the output of the VCO and that controls operation of the aided acquisition circuit responsive to the state of the tuning circuit, the control circuit further comprising a deactivation circuit that disables changes to the state of the tuning circuit when the transmit amplifier circuit is activated to amplify the output of the VCO.

24. The circuit of claim 23 wherein the control circuit is further configured to deactivate the aided acquisition circuit when the modulation circuit is varying the frequency of the modulated signal.

25. A method for locking a voltage controlled oscillator (VCO), oscillating at a first frequency with an existing relationship between an input and an output of the VCO, to a second frequency, the method comprising:

varying a tuning voltage signal to the input of the VCO over a plurality of values using an aided acquisition circuit;

monitoring the tuning voltage;

switching a state of a tuning circuit responsive to the monitored tuning voltage to select a new relationship between the input and the output of the VCO, the new relationship being different from the previously existing relationship; and varying the tuning voltage to the input of the VCO using the aided acquisition circuit responsive to switching the state of the tuning circuit to reapply at least one of the plurality of values to the input of the VCO; and locking the VCO at the second frequency with the new relationship.

26. The method of claim 25 wherein the tuning circuit has at least three states, each of which is associated with a different relationship between the input and the output of the VCO, the method further comprising repeating monitoring the tuning voltage, switching the state of the tuning circuit and varying the tuning voltage to the input of the VCO responsive to switching the state of the tuning circuit to reapply at least one of the plurality of values to the input of the VCO until the VCO is locked at the second frequency with one of the different relationships between the input and the output of the VCO.

27. The method of claim 25 further comprising disabling switching of the state of the tuning circuit when the VCO is locked at a desired frequency.

28. The method of claim 27 further comprising deactivating varying a tuning voltage signal to the input of the VCO over a plurality of values when the VCO is locked at the desired frequency.

29. The method of claim 25 further comprising:
receiving a new desired frequency for the VCO; and
restarting varying a tuning voltage signal to the input of the VCO over a plurality of values responsive to receipt of the new desired frequency.

30. The method of claim 29 further comprising switching the state of the tuning circuit to a reference state responsive to receipt of the new desired frequency.

31. The method of claim 25 wherein varying a tuning voltage signal to the input of the VCO over a plurality of values comprises sweeping a tuning voltage signal to the input of the VCO and wherein varying the tuning voltage to the input of the VCO responsive to switching the state of the tuning circuit to reapply at least one of the plurality of values to the input of the VCO comprises restarting sweeping the tuning voltage to the input of the VCO responsive to switching the state of the tuning circuit.

32. The method of claim 31 wherein restarting sweeping the tuning voltage to the input of the VCO responsive to switching the state of the tuning circuit comprises either resetting a sweep circuit that sweeps the tuning voltage or switching a sweep direction of the sweep circuit.

33. A method for changing a mobile terminal from transmitting on a first channel of a wireless network having a first associated modulation reference frequency to a second channel of the wireless network having a second associated modulation reference frequency, the method comprising:
enabling switching of a tuning circuit of a phase lock loop of the mobile terminal, the tuning circuit having a plurality of states, each of the states providing a different relationship between an input and an output of a voltage controlled oscillator (VCO) of the phase lock loop;

deactiving amplification of the output of the VCO by an amplifier circuit coupled to the output of the VCO while switching of the tuning circuit is enabled;

varying a tuning voltage signal to the input of the VCO over a plurality of values;

monitoring the tuning voltage;

switching a state of the tuning circuit responsive to the monitored tuning voltage to select a new relationship between the input and the output of the VCO, the new relationship being different from a previously existing relationship; and varying the tuning voltage to the input of the VCO responsive to switching the state of the tuning circuit to reapply at least one of the plurality of values to the VCO;

locking the VCO at the second frequency with the new relationship;

disabling switching of the tuning circuit responsive to locking of the VCO at the second frequency; and reactivating amplification of the output of the VCO by an amplifier circuit coupled to the output of the VCO while switching of the tuning circuit is disabled.

34. The method of claims 33 wherein varying a tuning voltage signal to the input of the VCO over plurality of values comprises sweeping a tuning voltage signal to the input of the VCO and wherein varying sweeping the tuning voltage to the input of the VCO responsive to switching the state of the tuning circuit to reapply at least one of the plurality of values to the VCO comprises restarting sweeping the tuning voltage to the input of the VCO responsive to switching the state of the tuning circuit.

35. The method of claim 34 wherein restarting sweeping the tuning voltage to the input of the VCO responsive to switching the state of the tuning circuit comprises restarting sweeping the tuning voltage by resetting a sweep circuit providing the sweeping of the tuning voltage or by switching a sweep direction of the sweep circuit.

36. The method of claim 33 wherein the input to the VCO is responsive to an output signal having a frequency of a modulation circuit coupled to the phase lock loop, the method further comprising deactivating varying of the frequency of the output signal of the modulation circuit while switching of the tuning circuit is enabled.

* * * * *